United States Patent [19]
Holmes

[11] 3,947,706
[45] Mar. 30, 1976

[54] VOLTAGE AND TEMPERATURE COMPENSATED LINEAR RECTIFIER

[75] Inventor: Julian C. Holmes, Oxon Hill, Md.

[73] Assignee: The United States of America as represented by the Secretary of the Navy, Washington, D.C.

[22] Filed: Apr. 30, 1975

[21] Appl. No.: 573,276

[52] U.S. Cl. ............. 307/310; 307/317 R; 324/119
[51] Int. Cl.² ..................................... H03K 3/26
[58] Field of Search ............ 307/310, 317; 324/119, 324/105, 72.5; 321/8

[56] References Cited
UNITED STATES PATENTS
| | | | |
|---|---|---|---|
| 3,329,896 | 4/1967 | Groot | 304/119 |
| 3,800,169 | 3/1974 | Diaz | 307/310 |

*Primary Examiner*—Stanley D. Miller, Jr.
*Assistant Examiner*—B. P. Davis
*Attorney, Agent, or Firm*—R. S. Sciascia; Arthur L. Branning; George A. Montanye

[57] ABSTRACT

An improved circuit for compensating for temperature and current variations in rectifier circuits used for converting alternating current to a proportional direct current, particularly at low voltages. A separate rectifier to be used as a circuit standard is maintained in close thermal proximity to other rectifiers as part of the conversion circuit. A voltage proportional to that across the standard is applied as a bias to a terminal of the circuit rectifiers to automatically compensate for temperature and current changes in the circuit and thereby provide a more accurate rectification of an input voltage.

5 Claims, 1 Drawing Figure

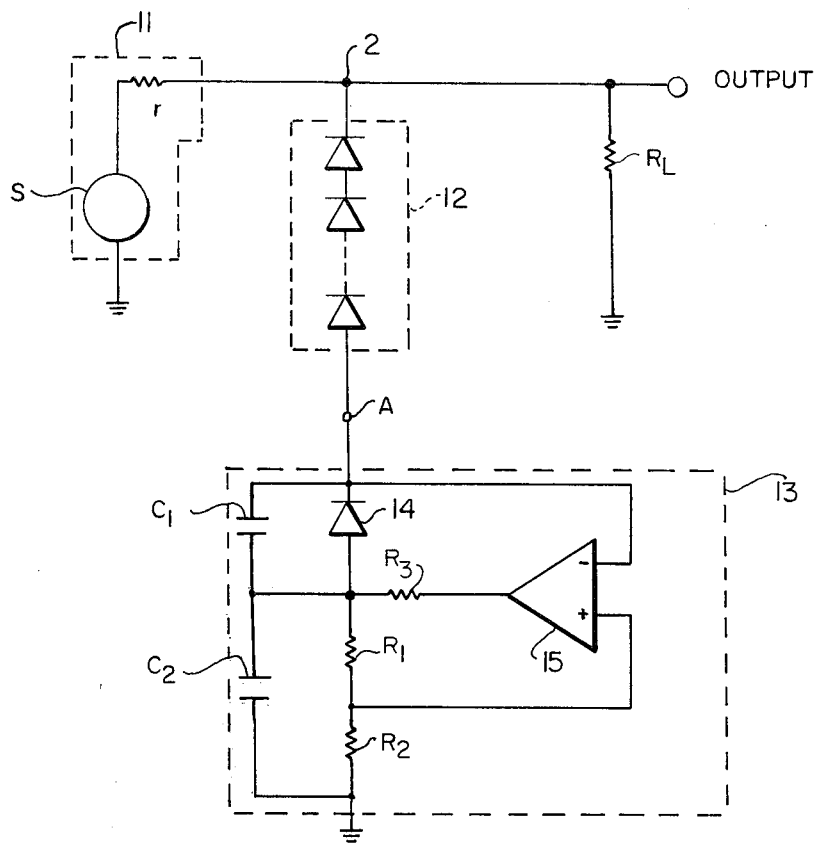

VOLTAGE AND TEMPERATURE COMPENSATED LINEAR RECTIFIER

BACKGROUND OF THE INVENTION

The present invention relates to alternating current rectifying circuits and more particularly to improved techniques for providing current and temperature compensated rectifying circuits at low voltages.

Alternating current to direct current conversion circuits are generally well known and usually employ standard solid state diodes to perform the conversion. Diodes, however, do not have a linear voltage-current relationship at low conduction voltages and therefore fail to provide a proportional rectified voltage, particularly at low input voltages. In addition, the voltage-current relationship of a diode does not remain constant with temperature and thereby causes changes in the conduction voltage and conduction impedance to further reduce the accuracy of voltage-current rectification.

Various circuits have been proposed to overcome the above noted deficiencies with each exhibiting different degrees of success. As is known, if it is desired that the rectified output voltage be proportional to the input voltage for both large and small values of input voltage, then it is necessary to apply a separate voltage bias to the rectifier so that rectification begins at zero input voltage. One such circuit designed to perform that function couples a fixed bias voltage to one terminal of the rectifier to compensate for the conduction voltage. While this particular arrangement provides improved rectification characteristics, the same is still subject to inaccuracies since the bias voltage is fiwed and remains independent of temperature and current changes in the conduction voltage and impedance.

While still many other circuits have been relatively successful in providing improved rectifier characteristics, there is still a need for new and improved devices capable of operation at both high and low voltages and over wide ranges of frequency. Accordingly, the present invention has been developed to overcome the specific shortcomings of the above known and similar techniques and to provide a technique for more precisely and reliably rectifying an alternating input voltage.

SUMMARY OF THE INVENTION

It is therefore an object of the present invention to provide a simple rectifier circuit for compensating for non-linearities in rectifier output.

Another object of the invention is to provide a rectifier circuit for automatically compensating for changes in diode conduction voltage with changes in diode current.

A still further object of the invention is to provide a rectifier circuit for automatically compensating for temperature variations in conduction voltage and impedance.

In order to accomplish the above and other objects, the invention provides for the formation of a rectifier circuit using a plurality of serially connected diodes. All of the diodes are maintained in thermal proximity such that temperature variations in any one of the diodes will be substantially the same for all of the other diodes in the circuit. A resistor dividing network is also connected in series with the diodes and the ratio of resistances in the network is set to provide a fixed multiplying factor dependent on the number of serially connected diodes. The fixed factor from the resistor network is then used to multiply the voltage across a chosen diode standard, and applied to a terminal of the rectifiers 12. As the temperature of the standard and the current through the standard change, the bias voltage across the rectifying diodes is automatically varied to provide a more accurate rectification of an input voltage.

Other objects, advantages and novel features of the invention will become apparent from the following detailed description of the invention when considered with the accompanying drawing wherein:

BRIEF DESCRIPTION OF THE DRAWING

The drawing shows a schematic diagram of the temperature and current compensating rectifier circuit according to the present invention.

DETAILED DESCRIPTION OF A PREFERRED EMBODIMENT

Referring now to the drawing, an input voltage source 11 is generally shown as represented by an alternating voltage source S and internal impedance r. One output from the source 11 is connected to terminal 2 to provide the input voltage to be rectified by the rectifiers 12. The rectifiers 12 (which can be any well known solid state diodes of silicon, germanium, etc.) are serially connected to form a group of diodes having the cathode of each succeeding diode connected to the anode of the preceeding diode in the series. In the present example, the cathode of the first diode in the series is connected to the terminal 2 which constitutes the output terminal from which the rectified voltage is derived. As shown by the drawing, the rectified output is delivered to a load between the output terminal and ground as generally represented by the load resistor $R_L$. While a plurality of diodes have been shown to form the group of rectifiers 12, a single, or any number of diode rectifiers could just as well be used depending on the particular requirements of the circuit.

According to the present invention, the compensating circuit 13 is coupled between the rectifiers 12 and ground to automatically compensate for current and temperature changes in the diode rectifiers 12. The compensating circuit 13 includes a diode 14 which is substantially identical to the diode rectifiers 12 and has its cathode connected to the anode of the last diode of the group of rectifiers 12 to form a diode standard. The diode 14 and each of the diode rectifiers 12 are maintained in thermal proximity to one another (e.g. mounted on same heat sink in close physical proximity) so that the diode 14 and each of the rectifiers 12 are at substantially the same temperature at any given time. The anode of the diode 14 is coupled to ground through a series combination of resistor $R_1$ and resistor $R_2$ which form a divider network. Capacitor $C_1$ is coupled across the anode and cathode terminals of the diode 14, while capacitor $C_2$ is coupled across the series combination of resistors $R_1$ and $R_2$ so that the capacitors generally form a high frequency bypass. Operational amplifier 15 has a positive input coupled to the junction between resistors $R_1$ and $R_2$ and a negative input coupled to the cathode of diode 14. The output of operational amplifier 15 is then coupled through resistor $R_3$ to the junction between the diode 14 and the resistor $R_1$ to provide the compensating voltage to the rectifiers 12 at point A.

The operation of the circuit will now be described with reference to the drawing. When a voltage is applied to the rectifiers 12 from a voltage source 11, the output will be a rectified voltage determined by the characteristics of the diodes 12. In the case of ideal diode rectifiers connected as shown, the output voltage would follow an alternating input voltage to provide a positive output for positive values of input voltage, and zero output for negative values of input voltage starting at 0 volts in the alternating input voltage. Solid state diodes, however, do not start conduction at 0 volts but, instead, require a bias voltage of a few tenths of a volt (dependent on the type of diode used) before conduction occurs. At low voltages this inaccuracy in diode conduction voltage causes substantial error in the output voltage and prevents the output voltage from being proportional to the actual or average input voltage as desired. In addition, the diode conduction voltage changes with changes in temperature of the diode, and current through the diode, thereby increasing the inaccuracies in voltage output for changes in environmental and operational conditions. As can be seen, since the conduction voltage is temperature and current dependent, the use of a constant bias source to offset the conduction voltage error only improves circuit output at a particular current and temperature, and still allows errors for changes in temperature and current.

Accordingly, the present invention provides a bias voltage to rectifiers 12 at point A which changes in accordance with the temperature and current changes of the diode 14. This variable bias voltage is derived using operational amplifier 15 to multiply the voltage across the diode 14 by a fixed factor determined by the number of rectifiers 12. In operation, the negative input of the operational amplifier 15 senses the voltage across the diode 14 and compares this voltage with the voltage sensed across resistor $R_1$ by the positive input. Because of the high gain of operational amplifier 15, any small difference between the voltages at the positive and negative inputs of the operational amplifier 15 will be indicated by a large voltage output from resistor $R_3$. Since the operational amplifier is connected as a feedback loop, the voltage from $R_3$ will act to maintain the voltages across the diode 14 and resistor $R_1$ at equal value. By circuit analysis, a stable condition will exist when the voltage across $R_2$ is equal to N times the voltage across $R_1$ where N is equal to the number of rectifiers 12. It can then be seen that if the ratio $R_2/R_1$ is made equal to N, the multiplication factor determined by the divider network $R_1$, $R_2$, will cause the voltage at A to be equal to N times the voltage across diode 14 (which is the same as the voltage across $R_2$). As a result, the voltage at A will be made to follow any changes in conduction voltage induced by temperature and current changes as sensed by diode 14. The proper bias voltage will therefore be maintained to initiate rectification at 0 volts and provide an output voltage that is proportional to input voltages for high and low voltages.

According to the present invention, the rectifier circuit can be implemented with different component values depending on the operational requirements. By way of example, the resistor $R_1$ can have a value of 1–50K with $R_2$ being equal to N times $R_1$, while capacitors $C_1$ and $C_2$ can have values of about 0.01 microfarads. Using components in these ranges, and presently available operational amplifiers, the circuit can be operated effectively from zero to several megahertz and beyond. Generally speaking, the circuit is limited to a frequency range fixed only by the response of the diodes rather than by the compensating circuit elements. However, the response of the circuit will be different depending on the frequency of the input voltage. At low frequencies the output voltage will be directly proportional to the instantaneous input voltage where the bias voltage at A is proportional to the instantaneous current through resistors $R_1$ and $R_2$. At high frequencies the bias voltage at point A tends to be proportional to an average current through resistors $R_1$ and $R_2$, and therefore does not exactly compensate for the conduction voltage error. In either case, however, the present invention provides a more accurate and proportional D.C. output voltage than a fixed bias source.

The advantages of the above described circuit are particularly evident where reliable response is required under severe environmental conditions, such as in upper air research and rocket borne instrumentation experiments. Using only conventional and inexpensive elements, a proportional rectified voltage can be derived for both high and low alternating voltage inputs over various ranges of temperature and current.

While the circuit has been described with reference to connections designed to provide a positive rectified output, it is apparent that the circuit could be modified for negative rectification in accordance with the teachings of the present invention. In addition, the resistor $R_3$ in the present example was included to form a phase shifting network with capacitor $C_2$ to prevent oscillations at frequencies where oscillation might otherwise tend to occur. Some presently available operational amplifiers include such phase shifting networks as part of their circuitry, and therefore eliminate the need for resistor $R_3$.

Obviously many other modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A rectifier compensating circuit comprising:
    at least one diode rectifier having a first and second terminal;
    a standard diode rectifier, having first and second terminals, said first terminal being coupled in series to the second terminal of said at least one diode rectifier;
    a first resistor coupled in series to the second terminal of said standard diode rectifier;
    a second resistor coupled in series with said first resistor and to ground;
    an operational amplifier having a positive input coupled to the junction between said first and second resistor, a negative input coupled to the first terminal of said standard diode rectifier, and an output coupled to the second terminal of said standard diode rectifier; and
    means for coupling an alternating source of input voltage between ground and said first terminal of said at least one diode rectifier.

2. The circuit of claim 1 wherein the ratio of said second resistor to said first resistor is equal to N where N equals the number of rectifiers forming said at least one diode rectifier.

3. The circuit of claim 2 wherein said standard diode rectifier is coupled in thermal proximity with said at least one diode rectifier such that the temperature of each is maintained substantially the same.

4. The circuit of claim 3 wherein said at least one diode rectifier comprises a plurality of serially connected diode rectifiers.

5. The circuit of claim 4 wherein the first terminal of each diode rectifier is a cathode terminal and the second terminal of each diode rectifier is an anode terminal.

* * * * *